(12) United States Patent
Todd

(10) Patent No.: US 6,825,130 B2
(45) Date of Patent: Nov. 30, 2004

(54) CVD OF POROUS DIELECTRIC MATERIALS

(75) Inventor: Michael A. Todd, Phoenix, AZ (US)

(73) Assignee: ASM Japan K.K. (JP)

(*) Notice: Subject to any disclaimer, the term of this patent is extended or adjusted under 35 U.S.C. 154(b) by 160 days.

(21) Appl. No.: 10/319,749

(22) Filed: Dec. 12, 2002

(65) Prior Publication Data

US 2004/0115954 A1 Jun. 17, 2004

(51) Int. Cl.[7] .................................................. H01L 21/31
(52) U.S. Cl. ...................................... 438/778; 438/779
(58) Field of Search ................................. 438/778–781, 438/787

(56) References Cited

U.S. PATENT DOCUMENTS

| | | | |
|---|---|---|---|
| 5,314,724 A | 5/1994 | Tsukune et al. | 427/489 |
| 5,470,802 A | 11/1995 | Gnade et al. | 437/238 |
| 5,569,058 A | 10/1996 | Gnade et al. | 445/24 |
| 5,847,443 A | 12/1998 | Cho et al. | 257/632 |
| 6,022,812 A | 2/2000 | Smith et al. | 438/761 |
| 6,054,206 A | 4/2000 | Mountsier | 428/312.8 |
| 6,059,553 A | 5/2000 | Jin et al. | 421/387 |
| 6,140,252 A | 10/2000 | Cho et al. | 438/781 |
| 6,171,945 B1 | 1/2001 | Mandal et al. | 438/622 |
| 6,204,202 B1 | 3/2001 | Leung et al. | 438/781 |
| 6,208,014 B1 | 3/2001 | Wu et al. | 257/629 |
| 6,238,751 B1 | 5/2001 | Mountsier | 427/574 |
| 6,261,357 B1 | 7/2001 | Egami et al. | 106/287.1 |
| 6,261,469 B1 | 7/2001 | Zakhidov et al. | 216/56 |
| 6,280,794 B1 | 8/2001 | Tu et al. | 427/379 |
| 6,387,824 B1 | 5/2002 | Aoi | 438/778 |
| 6,413,882 B1 | 7/2002 | Leung et al. | 438/781 |
| 6,444,495 B1 | 9/2002 | Leung et al. | 438/118 |
| 6,448,331 B1 | 9/2002 | Ioka et al. | 524/859 |
| 6,451,712 B1 | 9/2002 | Dalton et al. | 438/781 |
| 6,455,130 B1 | 9/2002 | Wallace et al. | 428/163 |
| 6,465,372 B1 * | 10/2002 | Xia et al. | 438/787 |
| 2001/0019037 A1 | 9/2001 | Zakhldov et al. | 218/56 |
| 2001/0038919 A1 | 11/2001 | Berry, III et al. | 428/446 |
| 2002/0086109 A1 | 7/2002 | Endo | 427/255.37 |
| 2002/0119676 A1 | 8/2002 | Aol | 438/778 |
| 2003/0064154 A1 * | 4/2003 | Iaxman et al. | 427/255.28 |

FOREIGN PATENT DOCUMENTS

| | | |
|---|---|---|
| JP | 10-092804 | 4/1998 |
| JP | 2002-075982 | 3/2002 |
| WO | WO 98/50945 | 11/1998 |
| WO | WO 00/81834 | 10/2000 |
| WO | WO 01/70628 A2 | 9/2001 |
| WO | WO 01/78127 | 10/2001 |

OTHER PUBLICATIONS

L. Hrubesh, Mat. Res. Soc. Symp. Proc. vol. 381, p. 267–272 (1995).

* cited by examiner

Primary Examiner—Dung A. Le
(74) Attorney, Agent, or Firm—Knobbe Martens Olson & Bear LLP

(57) ABSTRACT

Porous dielectric films useful in the semiconductor industry are prepared by depositing a Si—O—C film using precursors that contain carbon and oxygen, then heating the Si—O—C to decompose organic fragments trapped within.

48 Claims, 3 Drawing Sheets

US 6,825,130 B2

CVD OF POROUS DIELECTRIC MATERIALS

BACKGROUND OF THE INVENTION

1. Field of the Invention

This invention relates generally to porous dielectric films useful in the semiconductor industry, and more particularly to processes for making such films by chemical vapor deposition using chemical precursors that contain carbon and oxygen.

2. Description of the Related Art

As the dimensions of microelectronic devices become smaller, the importance of the physical properties of the materials used in their manufacture becomes more important. This is particularly true of the dielectric materials that are used to insulate metal lines and vias from one another because of the contributions to capacitance that these materials make. Silicon dioxide has been employed within the industry as a dielectric material for the manufacture of devices for nearly four decades, but may become less suitable in the future because of its relatively high dielectric constant (k~4.1).

The dielectric constant of silicon dioxide can be reduced by introducing porosity to produce a material known as porous silica. Wet methods for making porous silica typically involve coating a substrate with a solution that contains a solvent and a silica precursor, then evaporating the solvent under controlled conditions to form the porous silica. See, e.g., L. Hrubesh, Mat. Res. Soc. Symp. Proc. Vol. 381, p. 267–272 (1995); U.S. Pat. Nos. 5,470,802; 5,569,058; 5,847,443; 6,140,252; 6,208,014; and 6,261,357. U.S. Pat. No. 6,261,469 discloses a method for assembling small silica spheres into a lattice structure by a sedimentation process from a colloidal suspension of the silica spheres. U.S. Pat. No. 6,022,812 discloses depositing an alkoxysilane composition onto a substrate, exposing the deposited composition to water vapor and either an acid or a base vapor, and drying the composition to produce porous silica. PCT Patent Application WO 01/78127 discloses the use of a high density plasma to densify porous silica in order to make it more compatible for adhesion to a cap layer.

U.S. Pat. No. 6,171,945 discloses a method for depositing a porous silicon oxide layer using chemical vapor deposition. The method involves condensing a peroxide compound on the surface of a substrate and contacting the deposited peroxide compound with a reactive compound or mixture containing hydrogenated silicon. U.S. Pat. No. 6,238,751 discloses depositing an organic-group-containing silica precursor on a substrate in a chemical vapor deposition reactor, then removing the organic groups by heating or exposure to a plasma to produce a low density silica film.

There remains a need for porous silica materials having better properties more suitable for use in microelectronics manufacturing, and for processes for producing such materials that can be readily integrated into fabrication process flows.

SUMMARY OF THE INVENTION

A preferred embodiment provides a method for making a porous silica film, comprising depositing a Si—O—C film having a dielectric constant $k_1$ by chemical vapor deposition using a carbon oxygen compound and a silicon source, the carbon oxygen compound being free of silicon atoms; and heating the Si—O—C film to produce a porous silica film having a dielectric constant $k_2$, wherein $k_1 > k_2$.

Another preferred embodiment provides a method for making a porous silica film, comprising depositing a graded Si—O—C film having an overall dielectric constant $k_1$ by chemical vapor deposition using a feed gas, wherein the feed gas comprises an amount of a carbon oxygen compound that is varied over the course of the depositing; and heating the Si—O—C film to produce a graded porous silica film having an overall dielectric constant $k_2$; wherein $k_1 > k_2$ and wherein the graded porous silica film has a degree of porosity that varies significantly through the film.

Another preferred embodiment provides a method for making a porous silica film, comprising depositing a Si—O—C film having a dielectric constant $k_1$ by pulsed plasma-enhanced chemical vapor deposition using a carbon oxygen compound and a silicon source; and heating the Si—O—C film to produce a porous silica film having a dielectric constant $k_2$, wherein $k_1 > k_2$.

These and other embodiments are described in greater detail below.

BRIEF DESCRIPTION OF THE DRAWINGS

These and other aspects of the invention will be readily apparent from the following description and from the appended drawings, which are not to scale and which are meant to illustrate and not to limit the invention, and wherein.

DETAILED DESCRIPTION OF THE PREFERRED EMBODIMENTS

Porous silica films having advantageously low dielectric constants can be made by the methods described herein. The term "porous silica" refers to Si—O materials having small voids dispersed therein. As used herein, expressions such as "Si—O", "Si—O—C", "Si—C", etc. refer to materials that contain the indicated elements in various proportions. For example, "Si—O" is a material that comprises silicon and oxygen, and, optionally, other elements, e.g., carbon, hydrogen and/or nitrogen. "Si—O", "Si—O—N", "Si—O—C", and "Si—C" are not chemical formulas per se and thus are not limited to materials that contain particular ratios of the indicated elements. The size and distribution of voids within the porous silica is preferably effective to provide the porous silica with a dielectric constant that is lower than non-porous $SiO_2$.

Figure 1:
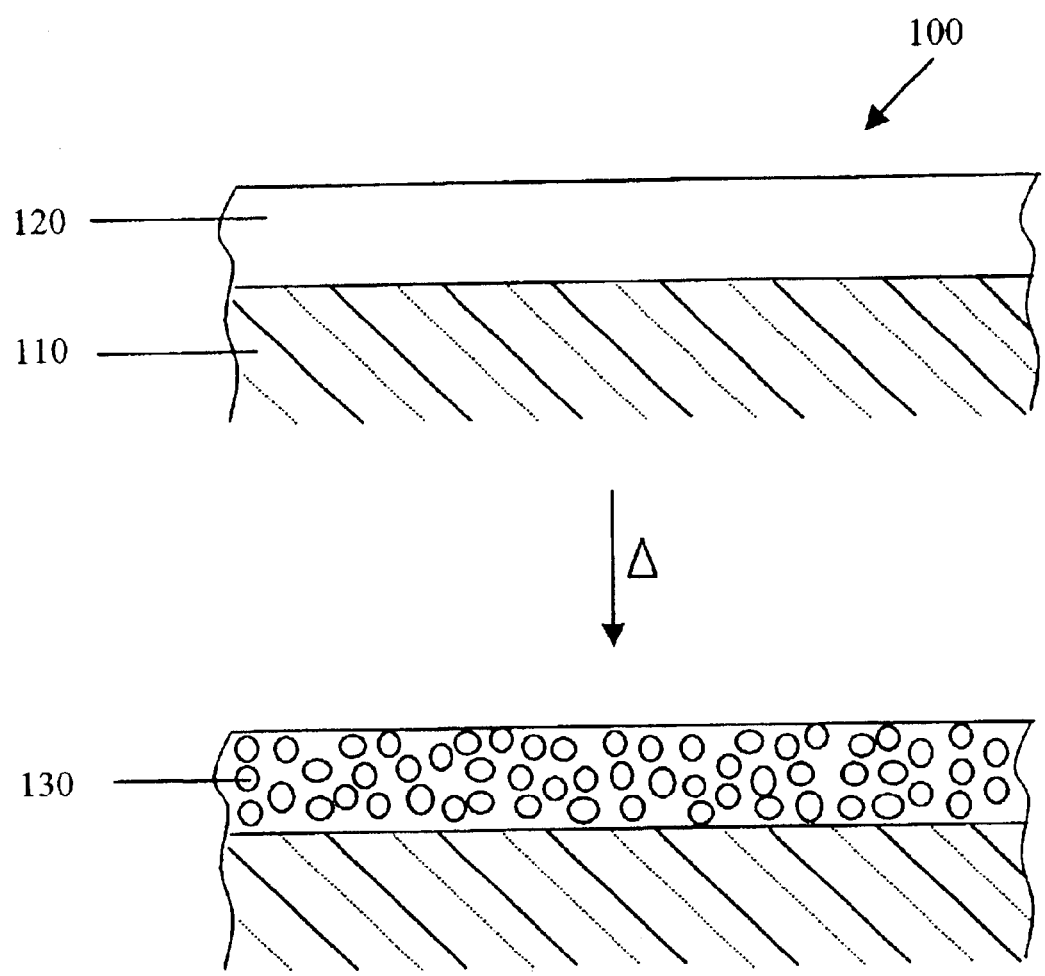
FIG. 1 is a schematic cross-section illustrating a preferred process for making a porous silica film 130 by heating a Si—O—C film 120.

Porous silica is preferably made by heating a precursor Si—O—C film as illustrated schematically in FIG. 1. In the illustrated embodiment, a structure 100, comprising a Si—O—C film 120 overlying a substrate 110, is heated to produce a porous film 130. The instant invention is not bound by any theory of operation, but it is believed that heating the precursor Si—O—C film causes at least part of the carbon and oxygen atoms contained therein to form gases such as carbon monoxide (CO) and carbon dioxide ($CO_2$). It is further believed that voids are formed, at least in part, by the departure, in gaseous form, of the carbon and oxygen atoms that were previously part of the Si—O—C material structure.

The size and distribution of the voids in the porous silica can be controlled by controlling the concentration and distribution of carbon and oxygen in the precursor Si—O—C film. In preferred embodiments, this is accomplished by incorporating selected amounts of silicon, oxygen, and carbon atoms during the deposition of the film by chemical vapor deposition ("CVD"). The term "chemical vapor deposition" is used herein in its usual sense and includes various methods for depositing materials on a surface from the vapor phase, including thermal CVD and plasma-enhanced CVD ("PECVD"). Deposition may be suitably conducted according to the various CVD methods known to those skilled in the art, but the greatest benefits are obtained when deposition is conducted according to the CVD methods taught herein.

Preferably, an in situ deposition is conducted by introducing a carbon oxygen compound and a silicon source to a CVD chamber under conditions that result in the deposition of a Si—O—C film. The term "carbon oxygen compound" as used herein refers to a compound that contain carbon and oxygen, and optionally other elements such as silicon, hydrogen, and/or nitrogen. The term "silicon source" as used herein refers to a compound that contain silicon and optionally other elements such as carbon, oxygen, hydrogen, and/or nitrogen. The carbon oxygen compound and the silicon source may be the same compound or different compounds. The relative amounts of silicon, oxygen and carbon incorporated into the Si—O—C film during deposition can be controlled by adjusting the CVD conditions and the relative amounts of carbon oxygen compound and a silicon source introduced to the CVD chamber.

The Si—O—C film is preferably deposited under conditions that facilitate void formation by minimizing molecular fragmentation of the carbon oxygen compound that is incorporated into the Si—O—C film. Although not bound by any theory, it is believed that the minimally fragmented carbon oxygen compound occupies a space within the Si—O—C film that, after decomposition, results in a void within a matrix of silicon or Si—O. When the Si—O—C film is heated, decomposition gases (e.g., CO, $CO_2$, and/or $H_2O$) are formed, and it is believed that the formation of decomposition gases is facilitated when the Si—O—C film contains minimally fragmented carbon oxygen compounds in which the carbon and oxygen atoms are in close proximity to one another. It is also believed that minimal fragmentation of the carbon oxygen compound minimizes the formation of chemical bonds between the carbon oxygen compound and the surrounding matrix, further facilitating decomposition and resultant void formation.

Figure 2:
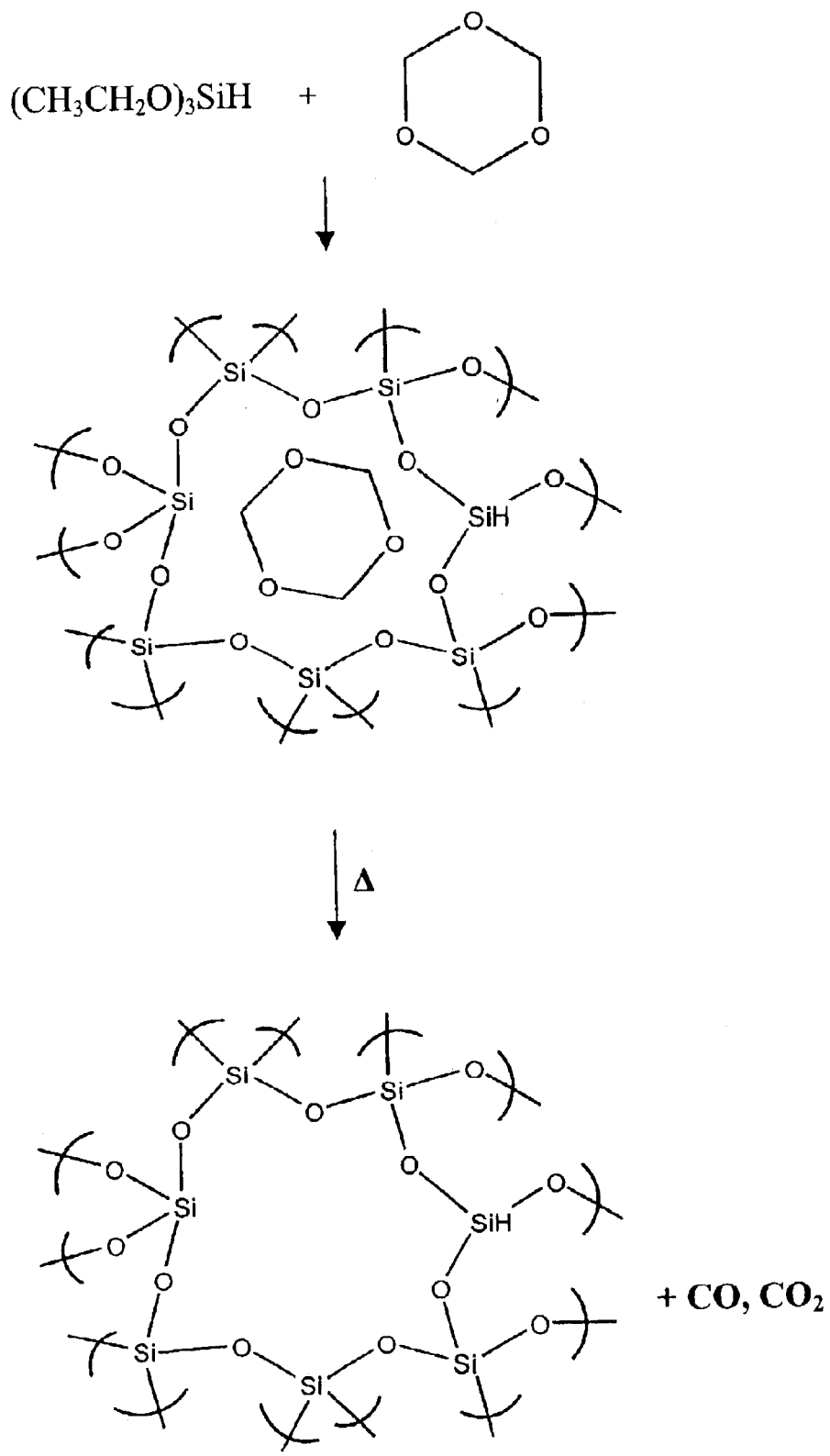
FIG. 2 is a schematic cross-section illustrating a preferred process in which a Si—O—C film containing minimally fragmented carbon oxygen compounds is deposited and then heated to form a porous silica film.

FIG. 2 schematically illustrates how porosity is facilitated by the incorporation and subsequent decomposition of minimally fragmented carbon oxygen compounds. In the illustrated embodiment, a mixture of 1,3,5-trioxane (carbon oxygen compound) and triethoxysilane (silicon source) is used in a PECVD process to deposit a Si—O—C film. The illustrated 1,3,5-trioxane molecule is not fragmented and occupies a space within the Si—O matrix formed during the deposition. Subsequent heating decomposes the 1,3,5-trioxane molecule into representative gases such as carbon monoxide and carbon dioxide that diffuse out of the space previously occupied by the 1,3,5-trioxane molecule, creating a void in the Si—O matrix. Those skilled in the art will appreciate that the chemical structures shown in FIG. 2 are illustrative and do not necessarily represent the actual stoichiometry of the process.

The methods described herein can be used to prepare porous silica in which the voids are extremely small, on the order of the size of a carbon oxygen molecule or fragment thereof. Those skilled in the art will appreciate that larger voids can result when multiple carbon oxygen compounds are trapped together within the matrix during deposition. Preferably, the voids in the porous silica have a diameter in the range of from about 5 Å to about 1000 Å, more preferably about 10 Å to about 50 Å. In the case of non-spherical voids, size is measured along the longest axis.

Electron microscopy can be used to determine the presence of voids within a porous silica sample, as well as the size, size distribution, number, and distribution of the voids. However, in practice it is often more convenient to characterize porous silica using a non-destructive technique that measures a physical characteristic of the sample that is affected by the presence of the voids, such as density or dielectric constant. Measurements of dielectric constant are preferred and may be used to follow the progress of the deposition process. For example, the precursor Si—O—C film deposited by chemical vapor deposition using a carbon oxygen compound typically has a dielectric constant k, in the range of about 3.5 to about 4.5. The Si—O—C film is then heated to produce a porous silica film having a dielectric constant $k_2$, where $k_1 > k_2$. Determination of $k_2$ is often a convenient and practical way to monitor changes in porosity during processing.

The dielectric constant $k_2$ for the porous silica film can be controlled by controlling the porosity of the silica film according to the teachings set forth herein. In a preferred embodiment, such control over the porosity (and hence $k_2$) is exercised by selecting a carbon oxygen compound and, optionally, a silicon source; selecting conditions for the deposition of the Si—O—C film; and selecting conditions for transforming the Si—O—C film into the porous silica film. Criteria for each of these selections are discussed to some extent above and to a greater extent below.

Preferred carbon oxygen compounds have relatively high vapor pressures to facilitate introduction to the CVD chamber in gaseous form. Such carbon oxygen compounds preferably have a molecular weight of about 300 or less, more preferably about 200 or less. Ethers, ketones, aldeydes, alcohols, esters, and carboxylic acids containing from 1 to 8 carbon atoms and from 1 to 6 oxygen atoms are preferred. Preferably, the numerical ratio of carbon to oxygen atoms in the carbon oxygen compound (carbon:oxygen atomic ratio) is in the range of about 3:1 to 1:3. Carbon oxygen compounds that are free of silicon atoms are preferably used in conjunction with a silicon source. Mixtures of carbon oxygen compounds may be used. Non-limiting examples of preferred carbon oxygen compounds include 1,3,5-trioxane, 3,6-dimethyl-1,4-dioxane-2,5-dione, 1,4-dioxane, succinic anhydride, vinylene carbonate, citraconic anhydride, itaconic anhydride, diallyl carbonate, vinyl acetate, allyl acetate, methyl vinyl ketone, dimethylpyrocarbonate, dimethyl oxalate, dimethyl carbonate, acetic anhydride, diacetoxydimethylsilane, and triacetoxyvinylsilane. For a given carbon oxygen compound, the porosity of the resulting porous silica film depends on the amount of labile carbon-oxygen ligand incorporated into the Si—O—C film that is subsequently eliminated by heating.

The carbon oxygen compound is preferably used in conjunction with a silicon source. Examples of preferred silicon sources include without limitation silane, disilane, trisilane, alkylsilane (e.g., methyl silane, dimethylsilane, trimethylsilane, and tetramethyl silane), alkoxysilane (e.g., methoxysilane, ethoxysilane, dimethoxysilane, diethoxysilane, trimethoxysilane, triethoxysilane, tetramethoxysilane, and tetraethoxysilane), alkylalkoxysilane (e.g., dimethyldimethoxysilane, diethyldiethoxysilane, diethyldimethoxysilane, methyltrimethoxysilane, trimethylmethoxysilane, etc.), alkylsiloxane (e.g., hexamethyldisiloxane, trimethyltriethyldisiloxane, etc.) alkoxysiloxane (e.g., hexamethoxydisiloxane, hexaethoxydisiloxane, etc.) and alkylalkoxysiloxane (e.g. tetramethyldimethoxydisiloxane, tetramethoxyethylmethyldisiloxane, etc.). Mixtures of silicon sources may be used. Silicon sources that do not contain oxygen atoms are preferably used in conjunction with an oxidant such as molecular oxygen, water vapor, NO, $N_2O$ or ozone in order to deposit a preferred Si—O or Si—O—N matrix that encapsulates the carbon oxygen compound. The Si—O or Si—O—N matrix resists decomposition and thus provides mechanical stability during the heating step.

The carbon oxygen compound (and silicon source, if used) is preferably introduced to a CVD chamber in the form of a gas or as a component of a feed gas. The total pressure in the CVD chamber is preferably in the range of about 0.001 torr to about 1000 torr, more preferably in the range of about 0.1 torr to about 850 torr, most preferably in the range of about 1 torr to about 760 torr, depending on the CVD technique employed. The partial pressure of carbon oxygen compound in the feed gas is suitably in the range of about 0.0001% to about 100% of the total pressure, preferably about 0.001% to about 50% of the total pressure. Higher partial pressures of carbon oxygen compound produce higher concentrations of carbon oxygen compound in the resulting Si—O—C film. The feed gas can include a gas or gases other than the carbon oxygen compound, such as silicon source, oxidant, and/or inert carrier gases. Hydrogen and nitrogen are preferred carrier gases for thermal CVD. Noble gases such as helium, neon, argon and krypton are preferred carrier gases for plasma CVD. The components of the feed gas can be introduced to CVD chamber via separate feed lines, or premixed and introduced to the chamber together.

Preferably, the carbon oxygen compound is introduced to the CVD chamber by way of a bubbler used with a carrier gas to entrain carbon oxygen compound vapor, more preferably a temperature controlled bubbler. The bubbler is preferably maintained at a temperature that is effective to provide the desired partial pressure of carbon oxygen compound in the CVD chamber, more preferably a temperature that is above the melting point of the carbon oxygen compound, but below the temperature at which it undergoes substantial fragmentation. Preferably, the carbon oxygen compound is heated to a temperature in the range of about 40° C. to about 230° C., more preferably about 70° C. to about 175° C., depending on the vapor pressure of the particular carbon oxygen compound or mixture.

Preferably, the carbon oxygen compound is entrained in a heated feed gas and supplied to the CVD chamber via one or more feed lines that are maintained at a temperature that is effective to prevent condensation and resultant clogging of the feed lines. The feed lines are preferably maintained at a temperature that is above the melting point of the carbon oxygen compound, more preferably above the boiling point of the carbon oxygen compound, but below the temperature at which it undergoes substantial fragmentation. Preferably, the feed lines are maintained at a temperature in the range of about 50° C. to about 230° C., more preferably about 70° C. to about 175° C., depending on the vapor pressure of the particular carbon oxygen compound or mixture.

The disclosed deposition methods are preferably practiced by employing CVD, including PECVD or thermal CVD, using conditions that minimize fragmentation of the carbon oxygen compound. PECVD is preferred. CVD is suitably conducted in a CVD chamber by introducing a feed gas to the chamber and depositing the Si—O—C film onto a substrate contained within the chamber, where the feed gas contains the carbon oxygen compound and any other active constituents, e.g., silicon source, oxidant, etc. The carbon oxygen compound and any other constituents can be introduced to the chamber via separate inlets, but are preferably pre-mixed and introduced to the chamber via a single inlet.

In PECVD, plasma energy is used to activate the constituents of the feed gas by applying an electromagnetic field, e.g., microwave or radio frequency energy, to the feed gas. The strength of the electromagnetic field is preferably selected to minimize fragmentation of the carbon oxygen compound. Preferred power levels may range up to about 5 kW. The plasma may be generated in the immediate vicinity of the substrate or in a remote location. Preferred substrate temperatures during PECVD range from about minus 10° C. to about 200° C., more preferably about 0° C. to about 150° C. The feed gas is preferably introduced at the PECVD chamber inlet, and the chamber is preferably backfilled with carrier gas to control the total pressure. Preferred total pressures are in the range of about 0.001 torr to about 10 torr, preferably about 0.01 torr to about 8 torr. Preferred partial pressures of carbon oxygen compound for PECVD are in the range of about 0.01 torr to about 8 torr, preferably about 0.05 torr to about 5 torr.

A preferred PECVD deposition technique utilizes a pulsed plasma (non-continuous wave) process, where the electromagnetic field is only applied during a portion of the activation and/or deposition process. For example, a preferred pulsed PECVD process comprises a series of deposition sequences, each sequence lasting a predetermined length of time, typically about one second or less. The length of each of the sequences in a series may be different from each other, but the sequence lengths are preferably the same during a particular series. During each sequence in a pulsed PECVD process, the electromagnetic field is applied for only a portion of the length of the particular sequence. The length of time that the electromagnetic field is applied may be varied from sequence to sequence, but is preferably the same during a particular series.

This invention is not bound by theory, but it is believed that the pulsed PECVD technique minimizes the fragmentation of the carbon oxygen compound. In a preferred pulsed plasma process, the length of each sequence is preferably in the range of about 5 milliseconds to about 500 milliseconds. During any particular sequence, the electromagnetic field is preferably applied for less than about 50% of the length of the sequence, i.e., less than 25 milliseconds out of a 50 millisecond sequence, less than about 250 milliseconds out of a 500 millisecond sequence, etc., and even more preferably applied for less than about 15% of the length of the sequence.

In thermal CVD, thermal energy is used to activate the constituents of the feed gas by adjusting the temperature of the substrate, preferably by heating the substrate to a temperature in the range of about 150° C. to about 450° C., more preferably about 250° C. to about 450° C., even more preferably about 300° C. to about 400° C. The feed gas is preferably introduced at the inlet, and the feed gas is preferably combined with carrier gas to control the total pressure. Preferred total pressures are in the range of about 0.1 torr to about 1000 torr, more preferably about 1 torr to about 760 torr, and most preferably about 50 torr to about 300 torr. Preferred partial pressures of carbon oxygen compound are in the range of about 0.01 torr to about 400 torr, more preferably about 0.1 torr to about 200 torr.

Suitable chambers for conducting PECVD, including pulsed PECVD, are commercially available, and preferred models include the Eagle™ series of reactors commercially available from ASM Japan K. K., of Tokyo, Japan. Suitable chambers for conducting thermal CVD are also commercially available and include the Epsilon™ series of single wafer epitaxial reactors, such as the Epsilon 2000®, commercially available from ASM America, Inc. of Phoenix, Ariz. Preferred models include the A400 series of batch tube reactors, such as the A400® and A412®, commercially available from ASM International N.V. of Bilthoven, The Netherlands. Commercially available CVD chambers are preferably equipped with a number of features, such as computer control of temperature, gas flow and switching, and chamber pressure, that can be manipulated to produce consistently high-quality films suitable for microelectronics applications. Those skilled in the CVD art are familiar with such methods and equipment, and thus routine experimentation may be used to select the appropriate conditions for depositing Si—O—C films using the carbon oxygen compounds described herein. Preferred Si—O—C film have a thickness in the range of about 200 Å to about 20,000 Å, more preferably about 500 Å to about 10,000 Å. Film thickness depends on deposition time, the types and amounts of carbon oxygen compound and silicon source (if any) in the feed gas, and the deposition technique, e.g., thermal CVD or PECVD.

The deposited Si—O—C film may have a dielectric constant $k_1$ in the range of about 3.5 to about 4.5, and often in the range of about 3.8 to about 4.3. Silicon dioxide typically has a dielectric constant of about 4.1, but may be changed somewhat by the presence of other elements such as carbon. Preferably, the Si—O—C film comprises a carbon oxygen compound, more preferably a minimally fragmented carbon oxygen compound derived from the carbon oxygen compound used to deposit the Si—O—C film. The original carbon oxygen compound is considered to be "minimally fragmented" if it maintains at least about 65% of its original mass over the course of the deposition. The original carbon oxygen compound may temporarily lose greater than 35% of its initial mass at any particular stage during deposition, but is still considered to be minimally fragmented so long as the resulting fragments at least partially recombine by the end of the deposition process to form a carbon oxygen compound having about 65% or more of the mass of the original carbon oxygen compound.

The amount of minimally fragmented carbon oxygen compound contained in the resulting Si—O—C film may be varied over a broad range by controlling the amount of silicon oxygen compound in the feed gas and the amount of energy supplied to the feed gas during deposition. Higher amounts of silicon oxygen compound in the feed gas generally produce higher levels of minimally fragmented carbon oxygen compound in the resulting Si—O—C film. Lower energy deposition conditions, e.g., lower temperatures for thermal CVD and less energetic plasmas for PECVD, tend to minimize fragmentation during deposition and produce increased amounts of minimally fragmented carbon oxygen compound in the resulting Si—O—C film. For PECVD, the temperature of the substrate is preferably maintained at a temperature that is low enough to condense the carbon oxygen compound onto or into the film. Preferably, the temperature of the substrate during deposition is below the boiling point and/or melting point of the carbon oxygen compound under the pressure conditions in the chamber during deposition. Preferred substrate temperatures are often less than about 100° C., more preferably less than about 40° C., depending on the carbon oxygen compound or mixture used. This invention is not bound by theory, but it is believed that condensation minimizes fragmentation of the carbon oxygen compound and also minimizes the formation of chemical bonds between the carbon oxygen compound and the Si—O—C film. Preferred amounts of minimally fragmented carbon oxygen compound contained in the resulting Si—O—C film may range from about 1% to about 80%, more preferably from about 5% to about 60%, most preferably from about 10% to about 40%, by weight based on the weight of the Si—O—C film.

The Si—O—C film is preferably heated to form a porous silica film having a dielectric constant $k_2$, where $k_2$ is less than $k_1$. Preferably, $k_2$ is about 3.5 or less, more preferably about 3.2 or less, even more preferably about 2.8 or less, most preferably about 2.5 or less. The Si—O—C film is preferably heated to a temperature that is effective to create porosity, preferably as evidenced by a decrease in dielectric constant. This invention is not bound by any theory of operation, but it is believed that heating drives the carbon out of the film, preferably by oxidizing the carbon to form a decomposition gas or gases such as carbon dioxide and carbon monoxide. An oxidant such as oxygen, water vapor and/or ozone may be added during heating to promote elimination of carbon-oxygen ligands or to promote additional bond formation between the Si—O matrix and the portion(s) of the decomposing carbon oxygen compounds that are not eliminated, and/or the Si—O—C film itself may be the source of the oxygen. Preferably, minimally fragmented carbon oxygen compounds in the Si—O—C film decompose to form carbon monoxide, carbon dioxide, water vapor, and/or other gaseous decomposition products, preferably leaving behind voids in the areas formerly occupied by the carbon oxygen compounds. To create porous silica films having preferred dielectric constants, the Si—O—C film is preferably heated to a temperature in the range of about 100° C. to about 700° C., more preferably about 150° C. to about 500° C. Decomposition is preferably conducted in a controlled fashion by raising the temperature relatively slowly, e.g., less than about 25° C. per minute. The Si—O—C films may be heated for a period of time effective to achieve the desired dielectric constant, preferably for a period of time in the range of from about 30 seconds to about 3 hours, more preferably about 2 minutes to about 2 hours.

The dielectric constant of the porous silica film can be controlled by manipulating various deposition and heating parameters. For example, increasing the amount of carbon in the Si—O—C film usually leads to greater porosity and lower dielectric constants. Depending on the dielectric constant desired, the amount of carbon in the Si—O—C film can be in the range of from about 0.01% to about 35%, preferably about 0.1% to about 25%, by weight based on the total weight of the film. For a given amount of carbon in the Si—O—C film, higher heating temperatures and/or longer heating times also tend to produce films having lower dielectric constants, as greater proportions of the carbon in the Si—O—C film are decomposed. Following these guidelines, routine experimentation may be used to prepare porous silica films have the desired dielectric constant.

In a preferred embodiment, the amount of carbon oxygen compound in the Si—O—C film is varied as a function of position within the film. Upon subsequent heating, this variance produces a graded porous silica film having a corresponding porosity variance. Preferably, the porous silica film has a porosity gradation as illustrated in FIG. 3.

In the illustrated embodiment, the porous silica film 300 contains a number of voids 305 of various sizes. A central region 320 of the film 300 contains a relatively high concentration of such voids, whereas the void concentration in the interface regions 310, 330 is lower. Thus, the porosity $P_1$ of the film 300 in the central region 320 is significantly higher than the porosity $P_2$ in the boundary regions 310, 330, producing a porosity gradation in film 300 as a function of film thickness.

Figure 3:
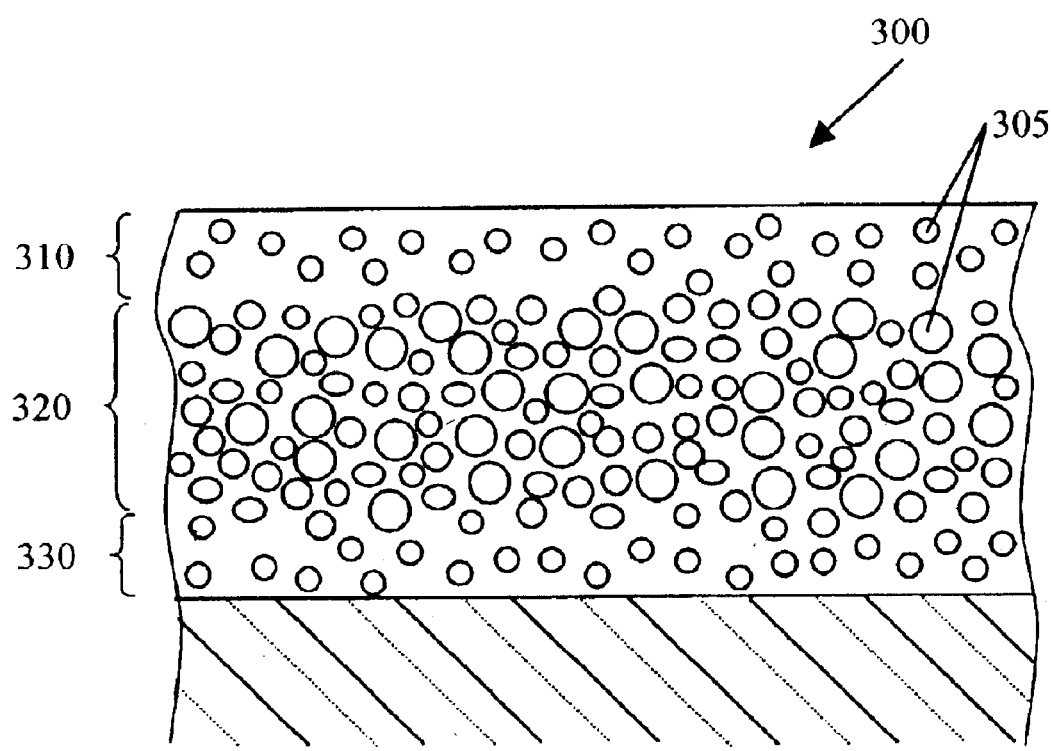
FIG. 3 is a schematic cross-section illustrating a preferred graded porous silica film 310 having a degree of porosity that varies significantly through the film.

A graded porous silica film such as the film 300 illustrated in FIG. 3 is preferably prepared by depositing a Si—O—C film in the general manner described above, except that the relative amount of carbon oxygen compound in the feed gas is varied over the course of the deposition process to deposit a graded Si—O—C film. For example, to form the film 300 illustrated in FIG. 3, the amount of carbon oxygen compound in the feed gas is relatively low during the initial deposition stage, during which the portion of the precursor Si—O—C film that is later heated to form the interface region 330 is deposited. As the deposition of the precursor Si—O—C film proceeds and the portion that is later heated to form the central region 320 is deposited, the amount of carbon oxygen compound in the feed gas is increased to a relatively high level, producing a correspondingly high level of minimally fragmented carbon oxygen compound within the central portion of the Si—O—C film. Likewise, the carbon concentration $C_1$ in the central portion is correspondingly high. As the deposition of the precursor Si—O—C film proceeds and the portion that is later heated to form the interface region 310 is deposited, the amount of carbon oxygen compound in the feed gas is decreased to a relatively low level, producing a correspondingly low level of minimally fragmented carbon oxygen compound within the interface portion of the Si—O—C film, as well as a correspondingly low carbon concentration $C_2$. The overall dielectric constant of the Si—O—C film is $k_1$.

Thus, the graded Si—O—C film that is heated to form the film 300 comprises a center region having a carbon concentration $C_1$ and an interface region having a carbon concentration $C_2$, where $C_1 > C_2$. Upon heating, preferably to a temperature in the range of about 150° C. to about 500° C., the minimally fragmented carbon oxygen compounds within the various regions of the Si—O—C film decompose to form the graded porous silica film 300. The film 300 comprises a central region 320 having a degree of porosity $P_1$, and an interface region 310 have a degree of porosity $P_2$, where $P_1 > P_2$. It is apparent that the other interface region 330 of the film 300 also has a porosity that, as shown, is less than $P_1$, and that may or may not be equal to $P_2$. The porosity in the region 330 is formed by the decomposition of the minimally fragmented carbon oxygen compound in the corresponding interface region of the precursor Si—O—C film. It will be apparent to those skilled in the art that a broad variety of porosity gradation profiles may be obtained in a similar manner by controlling the relative amount of minimally fragmented carbon oxygen compound incorporated into the Si—O—C film over the course of the deposition.

Porous silica films as described herein can undergo subsequent processing, e.g., to alter the silica surface by nitridation or oxidation, and/or to deposit subsequent layers onto the porous silica film. Post-oxidation using an oxidant is particularly useful for oxidizing any Si—H bonds on the surface of the porous silica film. Methods for conducting such additional processing steps are generally known to those skilled in the art.

EXAMPLE 1

A feed gas containing 1,4-dioxane having a partial pressure equal to about 5% of the total pressure, tetraethoxysilane having a partial pressure equal to about 10% of the total pressure, and helium carrier gas having a partial pressure equal to about 85% of the total pressure is introduced into an Eagle™ PECVD reactor chamber (obtained commercially from ASM Japan K. K., of Tokyo, Japan) maintained at a pressure of 2 Torr that contains a silicon substrate maintained at a temperature of 100° C. A plasma is initialed in this gas mixture using 13.56 MHz radiation at a power level of 2.0 Watts per square centimeter of substrate surface area and maintained for 15 minutes to deposit a 1000 Å Si—O—C film having a dielectric constant of 4.0 on the substrate. The plasma is terminated and the film is heated at a heating rate of about 10° C. per minute to a temperature of 300° C. and maintained at 300° C. for 15 minutes, then cooled to room temperature. The resulting porous silica film has a dielectric constant of 3.0.

EXAMPLE 2

A feed gas containing 1,3,5-trioxane having a partial pressure equal to about 10% of the total pressure, dimethyldimethoxysilane having a partial pressure equal to about 20% of the total pressure, and argon carrier gas having a partial pressure equal to about 70% of the total pressure is introduced into an Eagle™ PECVD reactor chamber (obtained commercially from ASM Japan K. K., of Tokyo, Japan) maintained at a pressure of 2 Torr that contains a silicon substrate maintained at a temperature of 100° C. A plasma is initiated in this gas mixture using 13.56 MHz radiation at a power level of 2.0 Watts per square centimeter of substrate surface area and maintained for 5 minutes to deposit the first portion (350 Å) of Si—O—C film. The partial pressure of the 1,3,5-trioxane is then increased to 15% and the partial pressure of dimethyldimethoxysilane decreased to about 10%, and deposition is continued for 5 minutes to deposit a second portion (300 Å) of Si—O—C film. The partial pressures of 1,3,5-trioxane and dimethyldimethoxysilane are then returned to their original values of 10% and 20%, respectively, and deposition is continued for 5 minutes to deposit a third portion (350 Å) of Si—O—C film. The resulting Si—O—C film has a total thickness 950 Å and an overall dielectric constant of 3.9. The plasma is terminated and the film is heated at a heating rate of about 20° C. per minute to a temperature of 250° C. and maintained at 250° C. for 15 minutes, then cooled to room temperature. The resulting porous silica film has an overall dielectric constant of 2.5.

The porous silica film is cross-sectioned and examined by electron microscopy. The first and third portions have less porosity than the second (central) portion.

EXAMPLE 3

A feed gas containing dimethyl oxalate having a partial pressure equal to about 5% of the total pressure, tetramethyldimethoxydisiloxane having a partial pressure equal to about 20% of the total pressure, oxygen having a partial pressure of 2% of the total pressure and argon carrier gas having a partial pressure equal to about 73% of the total pressure is introduced into an Eagle™ PECVD reactor chamber (obtained commercially from ASM Japan K. K., of Tokyo, Japan) maintained at a pressure of 6 Torr that contains a silicon substrate maintained at a temperature of 10° C. A plasma is intermittently initiated in this gas mixture using 13.56 MHz radiation at a power level of 4.0 Watts per square centimeter of substrate surface area with a duty cycle of 250 ms on and 750 ms off and maintained for 15 minutes to deposit a 7500 Å Si—O—C film having a dielectric constant of 3.7 on the substrate. The plasma is terminated and the film is heated at a heating rate of about 25° C. per minute to a temperature of 400° C. and maintained at 400° C. for 10 minutes, then cooled to room temperature. The resulting porous silica film has a dielectric constant of 2.3.

What is claimed is:

1. A method for making a porous silica film, comprising depositing a Si—O—C film having a dielectric constant $k_1$ by chemical vapor deposition using a carbon oxygen compound and a silicon source to thereby incorporate at least a portion of the carbon oxygen compound into the Si—O—C film, the carbon oxygen compound being free of silicon atoms; and heating the Si—O—C film to decompose the at least a portion of carbon oxygen compound to thereby produce a porous silica film having a dielectric constant $k_2$, wherein $k_1 > k_2$.

2. The method of claim 1, wherein the chemical vapor deposition is plasma-enhanced.

3. The method of claim 2 in which the chemical vapor deposition is pulsed plasma-enhanced.

4. The method of claim 2, further comprising heating the carbon oxygen compound to a temperature in the range of from about 40° C. to about 230° C.

5. The method of claim 4, wherein the carbon oxygen compound is selected from the group consisting of 1,3,5-trioxane, 3,6-dimethyl-1,4-dioxane-2,5-dione, 1,4-dioxane, succinic anhydride, vinylene carbonate, citraconic anhydride, itaconic anhydride, diallyl carbonate, vinyl acetate, allyl acetate, methyl vinyl ketone, dimethylpyrocarbonate, dimethyl oxalate, dimethyl carbonate, and acetic anhydride.

6. The method of claim 5, wherein the silicon source is selected from the group consisting of silane, disilane, trisilane, alkylsilane, alkoxysilane, alkylalkoxysilane, alkylsiloxane, alkoxysiloxane, and alkylalkoxysiloxane.

7. The method of claim 6 in which the silicon source is free of oxygen atoms.

8. The method of claim 7 in which the feed gas further comprises an oxidant.

9. The method of claim 1, wherein the carbon oxygen compound is selected from the group consisting of 1,3,5-trioxane, 3,6-dimethyl-1,4-dioxane-2,5-dione, vinylene carbonate, citraconic anhydride, diallyl carbonate, vinyl acetate, dimethylpyrocarbonate, and dimethyl oxalate.

10. The method of claim 1, wherein the carbon oxygen compound has a carbon:oxygen atomic ratio in the range of about 3:1 to 1.3.

11. The method of claim 1, wherein the Si—O—C film comprises an amount of carbon in the range of about 0.1% to about 25%, by weight based on total weight of the Si—O—C film.

12. The method of claim 1, wherein $k_2$ is about 3.2 or less.

13. The method of claim 1, wherein $k_2$ is about 2.8 or less.

14. The method of claim 1, wherein the Si—O—C film is heated to a temperature in the range of about 100° C. to about 700° C.

15. The method of claim 14, wherein the Si—O—C film is heated to a temperature in the range of about 150° C. to about 500° C.

16. The method of claim 1 comprising depositing the Si—O—C film onto a substrate, the substrate being maintained at a temperature that is low enough to condense the carbon oxygen compound onto or into the Si—O—C film.

17. The method of claim 1, further comprising nitriding or oxidizing the porous silica film.

18. A method for making a porous silica film, comprising depositing a graded Si—O—C film having an overall dielectric constant $k_1$ by chemical vapor deposition using a feed gas, wherein the feed gas comprises an amount of a carbon oxygen compound that is varied over the course of the depositing; and heating the Si—O—C film to produce a graded porous silica film having an overall dielectric constant $k_2$;

wherein $k_1 > k_2$ and wherein the graded porous silica film has a degree of porosity that varies significantly through the film.

19. The method of claim 18, wherein the chemical vapor deposition is plasma-enhanced.

20. The method of claim 19 in which the chemical vapor deposition is pulsed plasma-enhanced.

21. The method of claim 18, further comprising heating the carbon oxygen compound to a temperature in the range of from about 40° C. to about 230° C.

22. The method of claim 21, wherein the carbon oxygen compound is selected from the group consisting of 1,3,5-trioxane, 3,6-dimethyl-1,4-dioxane-2,5-dione, 1,4-dioxane, succinic anhydride, vinylene carbonate, citraconic anhydride, itaconic anhydride, diallyl carbonate, vinyl acetate, allyl acetate, methyl vinyl ketone, dimethylpyrocarbonate, dimethyl oxalate, dimethyl carbonate, acetic anhydride, diacetoxydimethylsilane, and triacetoxyvinylsilane.

23. The method of claim 18 in which the carbon oxygen compound is free of silicon atoms.

24. The method of claim 18 in which the feed gas further comprises a silicon source.

25. The method of claim 23, wherein the silicon source is selected from the group consisting of silane, disilane, trisilane, alkylsilane, alkoxysilane, alkylalkoxysilane, alkylsiloxane, alkoxysiloxane, and alkylalkoxysiloxane.

26. The method of claim 23, wherein the silicon source is free of oxygen atoms.

27. The method of claim 26 in which the feed gas further comprises an oxidant.

28. The method of claim 23, wherein the carbon oxygen compound is selected from the group consisting of 1,3,5-trioxane, 3,6-dimethyl-1,4-dioxane-2,5-dione, vinylene carbonate, citraconic anhydride, diallyl carbonate, vinyl acetate, dimethylpyrocarbonate, and dimethyl oxalate.

29. The method of claim 18 comprising depositing the graded Si—O—C film onto a substrate, the substrate being maintained at a temperature that is low enough to condense the carbon oxygen compound onto or into the graded Si—O—C film.

30. The method of claim 18, further comprising nitriding or oxidizing the graded porous silica film.

31. A method for making porous silica film, comprising depositing a Si—O—C film having a dielectric constant $k_1$ by pulsed plasma-enhanced chemical vapor deposition using a carbon oxygen compound and a silicon source, the carbon oxygen compound comprising hydrogen and being free of silicon atoms; and heating the Si—O—C film to produce a porous silica film having a dielectric constant $k_2$, wherein $k_1 > k_2$.

32. The method of claim 31 in which the pulsed plasma-enhanced chemical vapor deposition comprises a deposition sequence during which an electromagnetic field is applied for less than about 50% of the length of the sequence.

33. The method of claim 32 in which the length of the sequence is in the range of about 5 milliseconds to about 500 milliseconds.

34. The method of claim 32 in which the carbon oxygen compound is selected from the group consisting of 1,3,5-rioxane, 3,6-dimethyl-1,4-dioxane-2,5-dione, 1,4dioxane, succinic anhydride, vinylene carbonate, citraconic anhydride, itaconic anhydride, diallyl carbonate, vinyl acetate, allyl acetate, methyl vinyl ketone, dimethylpyrocarbonate, dimethyl oxalate, dimethyl carbonate, and acetic anhydride.

35. The method of claim 32 in which the silicon source is selected from the group consisting of silane, disilane, trisilane, alkylsilane, alkoxysilane, alkylalkoxysilane, alkylsiloxane, alkoxysiloxane, and alkylalkoxysiloxane.

36. The method of claim 35, wherein the silicon source is free of oxygen atoms.

37. The method of claim 35 in which the feed gas further comprises an oxidant.

38. The method of claim 31 comprising depositing the Si—O—C film onto a substrate, the substrate being maintained a: a temperature that is low enough to condense the carbon oxygen compound onto or into the Si—O—C film.

39. The method of claim 31, further comprising nitriding or oxidizing the porous silica film.

40. A method for making a porous silica film, comprising
depositing a graded Si—O—C film having an overall dielectric constant $k_1$ by plasma enhanced chemical vapor deposition using a feed gas, wherein the feed gas comprises an amount of a carbon oxygen compound that is varied over the course of the depositing; and
heating the Si—O—C film to produce a graded porous silica film having an overall dielectric constant $k_2$;
wherein $k_1 > k_2$ and wherein the graded porous silica film has a degree of porosity that varies significantly through the film; and
wherein the graded Si—O—C film comprises a center region having a carbon concentration $C_1$ and at least one interface region having a carbon concentration $C_2$, and wherein $C_1 > C_2$.

41. The method of claim 40, wherein the graded porous silica film comprises a center region having a degree of porosity $P_1$ and at least one interface region having a degree of porosity $P_2$, and wherein $P_1 > P_2$.

42. A method for making a porous silica film, comprising
depositing a Si—O—C film having a dielectric constant $k_1$ by pulsed plasma-enhanced chemical vapor deposition using a carbon oxygen compound and a silicon source; and
heating the Si—O—C film to produce a porous silica film having a dielectric constant $k_2$, wherein $k_1 > k_2$;
wherein the pulsed plasma-enhanced chemical vapor deposition comprises a deposition sequence during which an electromagnetic field is applied for less than about 50% of the length of the sequence.

43. The method of claim 42 in which the length of the sequence is in the range of about 5 milliseconds to about 500 milliseconds.

44. The method of claim 42 in which the carbon oxygen compound is selected from the group consisting of 1,3,5-trioxane, 3,6-dimethyl-1,4-dioxane-2,5-dione, 1,4-dioxane, succinic anhydride, vinylene carbonate, citraconic anhydride, itaconic anhydride, diallyl carbonate, vinyl acetate, allyl acetate, methyl vinyl ketone, dimethylpyrocarbonate, dimethyl oxalate, dimethyl carbonate, acetic anhydride, diacetoxydimethylsilane, and triacetoxyvinylsilane.

45. The method of claim 42 in which the silicon source is selected from the group consisting of silane, disilane, trisilane, alkylsilane, alkoxysilane, alkylalkoxysilane, alkylsiloxane, alkoxysiloxane, and alkylalkoxysiloxane.

46. The method of claim 45, wherein the silicon source is free of oxygen atoms.

47. The method of claim 45 in which the feed gas further comprises an oxidant.

48. A method for making a porous silica film, comprising
depositing a Si—O—C film having a dielectric constant $k_1$ by chemical vapor deposition using a carbon oxygen compound and a silicon source, the carbon oxygen compound being free of silicon atoms; and
heating the Si—O—C film to produce a porous silica film having a dielectric constant $k_2$, wherein $k_1 > k_2$;
wherein the carbon oxygen compound is selected from the group consisting of 1,3,5-trioxane, 3,6-dimethyl-1,4-dioxane-2,5-dione, 1,4-dioxane, succinic anhydride, vinylene carbonate, citraconic anhydride, itaconic anhydride, diallyl carbonate, vinyl acetate, allyl acetate, methyl vinyl ketone, dimethylpyrocarbonate, dimethyl oxalate, dimethyl carbonate, and acetic anhydride.

* * * * *

UNITED STATES PATENT AND TRADEMARK OFFICE
CERTIFICATE OF CORRECTION

| | | |
|---|---|---|
| PATENT NO. | : 6,825,130 B2 | Page 1 of 1 |
| APPLICATION NO. | : 10/319749 | |
| DATED | : November 30, 2004 | |
| INVENTOR(S) | : Michael A. Todd | |

It is certified that error appears in the above-identified patent and that said Letters Patent is hereby corrected as shown below:

On page 1, Column 2, under U.S. Patent Documents, Line 9, Delete "Zakhldov et al." and insert --Zakhidov et al.--, therefor.

On page 1, Column 2, under U.S. Patent Documents, Line 12, Delete "Aol" and insert --Aoi--, therefor.

On page 1, Column 2, under Foreign Patent Documents, Line 4, Delete "WO 00/81834" and insert --WO 00/61834--, therefor.

In Column 11, Line 49, In Claim 10, delete "1.3" and insert --1:3--, therefor.

In Column 12, Line 53, In Claim 31, after "making" insert --a--.

In Column 13, Line 3, In Claim 34, delete "rioxane" and insert --trioxane--, therefor.

In Column 13, Line 3, in Claim 34, delete "4dioxane" and insert --4-dioxane--, therefor.

In Column 13, Line 18, In Claim 38, delete "a:" and insert --at--, therefor.

In Column 13, Line 24, In Claim 40, delete "plasma enhanced" and insert --plasma-enhanced--, therefor.

Signed and Sealed this

Twenty-sixth Day of December, 2006

JON W. DUDAS
*Director of the United States Patent and Trademark Office*